US010026739B2

(12) United States Patent
Masuoka et al.

(10) Patent No.: US 10,026,739 B2
(45) Date of Patent: *Jul. 17, 2018

(54) SEMICONDUCTOR DEVICE HAVING PILLAR-SHAPED SEMICONDUCTOR LAYERS

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/610,882

(22) Filed: Jun. 1, 2017

(65) Prior Publication Data
US 2017/0271331 A1    Sep. 21, 2017

Related U.S. Application Data

(63) Continuation of application No. PCT/JP2015/056247, filed on Mar. 3, 2015.

(51) Int. Cl.
*H01L 27/092* (2006.01)
*H01L 29/786* (2006.01)
(Continued)

(52) U.S. Cl.
CPC ........ *H01L 27/092* (2013.01); *H01L 23/5286* (2013.01); *H01L 29/42392* (2013.01);
(Continued)

(58) Field of Classification Search
CPC .............. H01L 27/092; H01L 23/5286; H01L 29/4908; H01L 29/42392; H01L 29/78642; H01L 29/45
See application file for complete search history.

(56) References Cited

U.S. PATENT DOCUMENTS 5,308,778 A    5/1994  Fitch et al.
9,431,501 B2 *  8/2016  Masuoka ............ H01L 29/7827
(Continued)

FOREIGN PATENT DOCUMENTS

JP    H02-71556    3/1990
JP    H02-188966   7/1990
(Continued)

OTHER PUBLICATIONS

International Search Report and Written Opinion, and English language translation thereof, in corresponding International Application No. PCT/JP2015/056247, dated Jun. 2, 2015, 10 pages.
(Continued)

*Primary Examiner* — William Coleman
(74) *Attorney, Agent, or Firm* — Brinks Gilson & Lione

(57) ABSTRACT

A semiconductor device includes a first pillar-shaped semiconductor layer in which a second first-conductivity-type semiconductor layer, a first body region, a third first-conductivity-type semiconductor layer, a fourth first-conductivity-type semiconductor layer, a second body region, a fifth first-conductivity-type semiconductor layer, a first second-conductivity-type semiconductor layer, a third body region, and a second second-conductivity-type semiconductor layer are formed from a substrate side in this order; first, second, and third gates formed around first, second, third gate insulating films formed around the first, second, and third body regions, respectively; a first output terminal connecting the fifth first-conductivity-type semiconductor layer and the first second-conductivity-type semiconductor layer; a second pillar-shaped semiconductor layer, on the first output terminal, in which a third second-conductivity-type semiconductor layer, a fourth body region, and a fourth second-conductivity-type semiconductor layer are formed from the
(Continued)

substrate side in this order; and a fourth gate insulating film formed around the fourth body region.

16 Claims, 2 Drawing Sheets

(51) Int. Cl.
    *H01L 29/423*     (2006.01)
    *H01L 29/45*     (2006.01)
    *H01L 29/49*     (2006.01)
    *H01L 23/528*     (2006.01)

(52) U.S. Cl.
    CPC .......... *H01L 29/45* (2013.01); *H01L 29/4908* (2013.01); *H01L 29/78642* (2013.01)

(56) References Cited

U.S. PATENT DOCUMENTS

| | | | |
|---|---|---|---|
| 9,673,321 B2* | 6/2017 | Masuoka | ............ H01L 29/7827 |
| 9,741,801 B2* | 8/2017 | Masuoka | .............. H01L 29/401 |
| 9,780,179 B2* | 10/2017 | Masuoka | .......... H01L 29/42392 |
| 2003/0136978 A1 | 7/2003 | Takaura et al. | |
| 2016/0071851 A1* | 3/2016 | Masuoka | ............ H01L 27/0207 257/401 |

FOREIGN PATENT DOCUMENTS

| | | |
|---|---|---|
| JP | H03-145761 | 6/1991 |
| JP | H06-13623 A | 1/1994 |
| JP | 2003-224211 A | 8/2003 |
| JP | 2007-250652 A | 9/2007 |
| JP | 2008-300558 A | 12/2008 |
| JP | 2014-57068 A | 3/2014 |

OTHER PUBLICATIONS

Office Action, and English language translation thereof, in corresponding Japanese Application No. 2016-542786, dated Dec. 5, 2016, 5 pages.

International Preliminary Report on Patentability in corresponding International Application No. PCT/JP2015/056247, dated Sep. 14, 2017, 7 pages.

\* cited by examiner

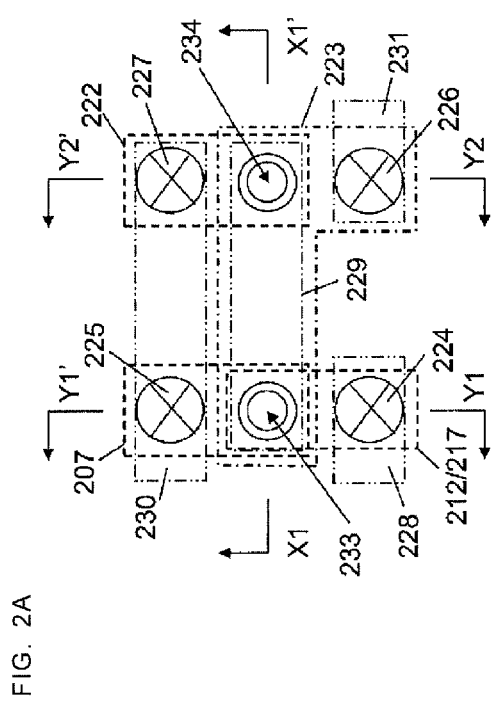

SEMICONDUCTOR DEVICE HAVING PILLAR-SHAPED SEMICONDUCTOR LAYERS

RELATED APPLICATIONS

The present application is a continuation of International Application PCT/JP2015/056247, with an international filing date of Mar. 3, 2015, the entire contents of which are incorporated herein by reference.

BACKGROUND OF THE INVENTION

1. Field of the Invention

The present invention relates to a semiconductor device.

2. Description of the Related Art

The degree of integration of semiconductor integrated circuits, particularly, integrated circuits using metal oxide semiconductor (MOS) transistors continues to increase. With the increase in the degree of integration, MOS transistors used in such integrated circuits have been miniaturized to the nanometer scale. Such miniaturization of MOS transistors makes it difficult to suppress leak current and causes an issue in that the area occupied by the circuits is not easily reduced because of a requirement to provide a necessary amount of current. To address such an issue, a surrounding gate transistor (hereinafter, referred to as an "SGT") has been proposed which has a structure in which a source, a gate, and a drain are arranged vertically with respect to a substrate and an gate electrode surrounds a pillar-shaped semiconductor layer (see, for example, Japanese Unexamined Patent Application Publication Nos. 2-71556, 2-188966, and 3-145761).

In existing inverters using SGTs, a single transistor is formed for a single silicon pillar, and an nMOS transistor constituted by a single silicon pillar and a pMOS transistor constituted by a single silicon pillar are formed on a plane (see, for example, Japanese Unexamined Patent Application Publication No. 2008-300558). Since at least two silicon pillars are formed on a plane, an area for the at least two silicon pillars is needed.

In existing nonvolatile memory devices, a plurality of gates are formed for a single silicon pillar (see, for example, Japanese Unexamined Patent Application Publication No. 2014-57068). A gate insulating film is formed on the sidewall of the silicon pillar, and a source line and a bit line are connected to an upper end and a lower end of the silicon pillar.

SUMMARY OF THE INVENTION

Accordingly, it is an object of the present invention to provide a highly integrated semiconductor device in which transistors are stacked.

A semiconductor device according to an aspect of the present invention includes a first first-conductivity-type semiconductor layer formed on a semiconductor substrate; a first pillar-shaped semiconductor layer which is forming above the semiconductor substrate and in which a second first-conductivity-type semiconductor layer, a first body region, a third first-conductivity-type semiconductor layer, a fourth first-conductivity-type semiconductor layer, a second body region, a fifth first-conductivity-type semiconductor layer, a first second-conductivity-type semiconductor layer, a third body region, and a second second-conductivity-type semiconductor layer are formed from a substrate side in this order; a first gate insulating film formed around the first body region; a first gate formed around the first gate insulating film; a second gate insulating film formed around the second body region; a second gate formed around the second gate insulating film; a third gate insulating film formed around the third body region; a third gate formed around the third gate insulating film; a first output terminal connecting the fifth first-conductivity-type semiconductor layer and the first second-conductivity-type semiconductor layer to each other; a second pillar-shaped semiconductor layer which is formed on the first output terminal and in which a third second-conductivity-type semiconductor layer, a fourth body region, and a fourth second-conductivity-type semiconductor layer are formed from the substrate side in this order; a fourth gate insulating film formed around the fourth body region; and a fourth gate formed around the fourth gate insulating film, wherein the first output terminal is connected to the third second-conductivity-type semiconductor layer, wherein the first gate and the fourth gate are connected to each other, and wherein the second gate and the third gate are connected to each other.

In addition, the semiconductor device may further include a first contact connecting the second gate and the third gate to each other.

In addition, the first conductivity type may be an n-type and the second conductivity type may be a p-type.

In addition, the first output terminal may be composed of a metal.

In addition, the first output terminal may be composed of a semiconductor.

In addition, the first gate, the second gate, the third gate, and the fourth gate may be each composed of a metal.

In addition, the semiconductor device may further include a first power supply line connected to the second second-conductivity-type semiconductor layer and the fourth second-conductivity-type semiconductor layer.

In addition, the first pillar-shaped semiconductor layer may be arranged in a first column of a first row and the second pillar-shaped semiconductor layer may be arranged in a second column of the first row.

A semiconductor device according to another aspect of the present invention includes a fifth second-conductivity-type semiconductor layer formed on a semiconductor substrate; a third pillar-shaped semiconductor layer which is formed above the semiconductor substrate and in which a sixth second-conductivity-type semiconductor layer, a fifth body region, a seventh second-conductivity-type semiconductor layer, a sixth first-conductivity-type semiconductor layer, a sixth body region, a seventh first-conductivity-type semiconductor layer, an eighth first-conductivity-type semiconductor layer, a seventh body region, and a ninth first-conductivity-type semiconductor layer are formed from a substrate side in this order; a fifth gate insulating film formed around the fifth body region; a fifth gate formed around the fifth gate insulating film; a sixth gate insulating film formed around the sixth body region; a sixth gate formed around the sixth gate insulating film; a seventh gate insulating film formed around the seventh body region; a seventh gate formed around the seventh gate insulating film; a second output terminal connecting the seventh second-conductivity-type semiconductor layer and the sixth first-conductivity-type semiconductor layer to each other; a fourth pillar-shaped semiconductor layer which is formed above the semiconductor substrate and in which an eighth second-conductivity-type semiconductor layer, an eighth body region, and a ninth second-conductivity-type semiconductor layer are formed from the substrate side in this order; an eighth gate insulating film formed around the eighth body region; and an eighth gate formed around the eighth gate insulating film, wherein the second output terminal is connected to the ninth second-conductivity-type semiconductor layer, wherein the fifth gate and the sixth gate are connected to each other, and wherein the seventh gate and the eighth gate are connected to each other.

In addition, the semiconductor device may further include a second contact connecting the fifth gate and the sixth gate to each other.

In addition, the first conductivity type may be an n-type and the second conductivity type may be a p-type.

In addition, the second output terminal may be composed of a metal.

In addition, the second output terminal may be composed of a semiconductor.

In addition, the fifth gate, the sixth gate, the seventh gate, and the eighth gate may be each composed of a metal.

In addition, the semiconductor device may further include a first ground line connected to the ninth first-conductivity-type semiconductor layer.

In addition, the third pillar-shaped semiconductor layer may be arranged in a first column of a first row, and the fourth pillar-shaped semiconductor layer may be arranged in a second column of the first row.

According to the aspects of the present invention, a highly integrated semiconductor device in which transistors are stacked can be provided.

In addition, the semiconductor device includes a first first-conductivity-type semiconductor layer formed on a semiconductor substrate; a first pillar-shaped semiconductor layer which is formed above the semiconductor substrate and in which a second first-conductivity-type semiconductor layer, a first body region, a third first-conductivity-type semiconductor layer, a fourth first-conductivity-type semiconductor layer, a second body region, a fifth first-conductivity-type semiconductor layer, a first second-conductivity-type semiconductor layer, a third body region, and a second second-conductivity-type semiconductor layer are formed from a substrate side in this order; a first gate insulating film formed around the first body region; a first gate formed around the first gate insulating film; a second gate insulating film formed around the second body region; a second gate formed around the second gate insulating film; a third gate insulating film formed around the third body region; a third gate formed around the third gate insulating film; a first output terminal connecting the fifth first-conductivity-type semiconductor layer and the first second-conductivity-type semiconductor layer to each other; a second pillar-shaped semiconductor layer which is formed on the first output terminal and in which a third second-conductivity-type semiconductor layer, a fourth body region, and a fourth second-conductivity-type semiconductor layer are formed from the substrate side in this order; a fourth gate insulating film formed around the fourth body region; and a fourth gate formed around the fourth gate insulating film. The first output terminal is connected to the third second-conductivity-type semiconductor layer. The first gate and the fourth gate are connected to each other. The second gate and the third gate are connected to each other. Since transistors are stacked in this way, a highly integrated semiconductor device can be provided. In particular, since transistors constitute NAND gates, SGTs can be vertically stacked in the nMOS layer. In addition, since the nMOS layer and the pMOS layer are different layers, the number of lithography steps for enabling doping with different impurities can be reduced during fabrication.

In addition, the semiconductor device includes a fifth second-conductivity-type semiconductor layer formed on a semiconductor substrate; a third pillar-shaped semiconductor layer which is formed above the semiconductor substrate and in which a sixth second-conductivity-type semiconductor layer, a fifth body region, a seventh second-conductivity-type semiconductor layer, a sixth first-conductivity-type semiconductor layer, a sixth body region, a seventh first-conductivity-type semiconductor layer, an eighth first-conductivity-type semiconductor layer, a seventh body region, and a ninth first-conductivity-type semiconductor layer are formed from a substrate side in this order; a fifth gate insulating film formed around the fifth body region; a fifth gate formed around the fifth gate insulating film; a sixth gate insulating film formed around the sixth body region; a sixth gate formed around the sixth gate insulating film; a seventh gate insulating film formed around the seventh body region; a seventh gate formed around the seventh gate insulating film; a second output terminal connecting the seventh second-conductivity-type semiconductor layer and the sixth first-conductivity-type semiconductor layer to each other; a fourth pillar-shaped semiconductor layer which is formed above the semiconductor substrate and in which an eighth second-conductivity-type semiconductor layer, an eighth body region, and a ninth second-conductivity-type semiconductor layer are formed from the substrate side in this order; an eighth gate insulating film formed around the eighth body region; and an eighth gate formed around the eighth gate insulating film. The second output terminal is connected to the ninth second-conductivity-type semiconductor layer. The fifth gate and the sixth gate are connected to each other. The seventh gate and the eighth gate are connected to each other. Since both the third pillar-shaped semiconductor layer and the fourth pillar-shaped semiconductor layer can be formed above the semiconductor substrate in this way, a single crystal semiconductor can be used with which both the third pillar-shaped semiconductor layer and the fourth pillar-shaped semiconductor layer are obtained by processing the substrate. In particular, since transistors constitute NAND gates, SGTs can be vertically stacked in the nMOS layer. In addition, since the nMOS layer and the pMOS layer are different layers, the number of lithography steps for enabling doping with different impurities can be reduced during fabrication.

BRIEF DESCRIPTION OF THE DRAWINGS

FIG. 2A is a plan view of a semiconductor device according to another embodiment of the present invention, FIG. 2B is a sectional view taken along line X1-X1' illustrated in FIG. 2A, FIG. 2C is a sectional view taken along line Y1-Y1' illustrated in FIG. 2A, and FIG. 2D is a sectional view taken along line Y2-Y2' illustrated in FIG. 2A.

DETAILED DESCRIPTION OF THE PREFERRED EMBODIMENTS

Figure 1D:
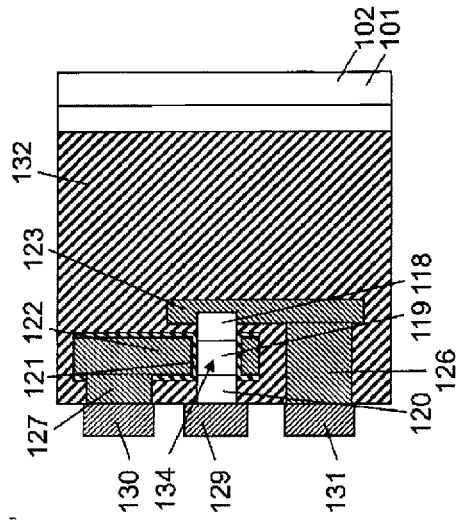
FIG. 1D is a sectional view taken along line Y2-Y2' illustrated in FIG. 1A.
Figure 1C:
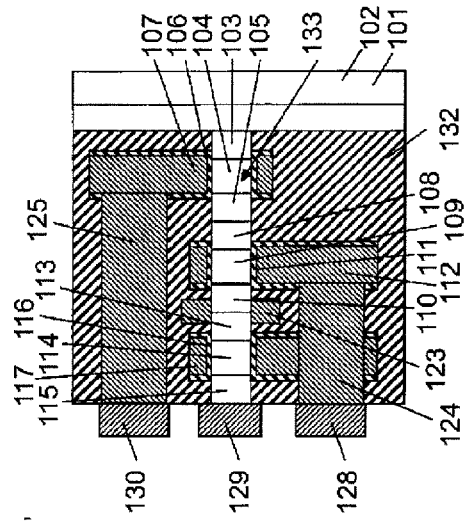
FIG. 1C is a sectional view taken along line Y1-Y1' illustrated in FIG. 1A.
Figure 1A:
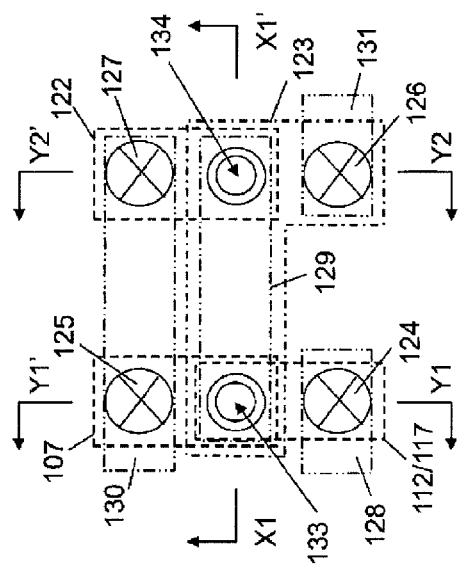
FIG. 1A is a plan view of a semiconductor device according to an embodiment of the present invention.
Figure 1B:
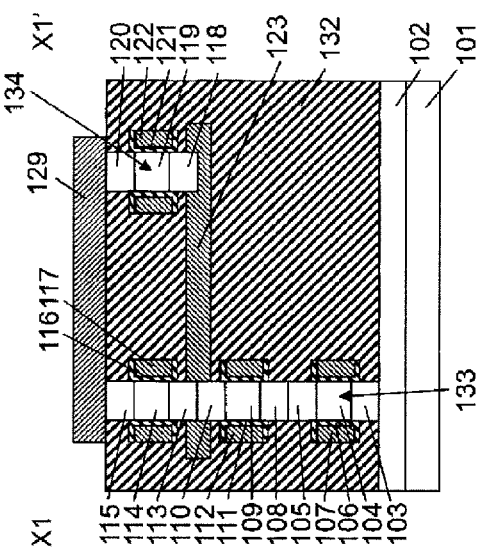
FIG. 1B is a sectional view taken along line X1-X1' illustrated in FIG. 1A.

Embodiments of the present invention will be described below. FIGS. 1A to 1D illustrate the structure of a semiconductor device according to an embodiment of the present invention. In this embodiment, silicon is used as a semiconductor; however, a semiconductor other than silicon may be alternatively used.

The semiconductor device includes a first first-conductivity-type silicon layer 102 formed on a silicon substrate 101; a first pillar-shaped silicon layer 133 which is formed above the silicon substrate 101 and in which a second first-conductivity-type silicon layer 103, a first body region 104, a third first-conductivity-type silicon layer 105, a fourth first-conductivity-type silicon layer 108, a second body region 109, a fifth first-conductivity-type silicon layer 110, a first second-conductivity-type silicon layer 113, a third body region 114, and a second second-conductivity-type silicon layer 115 are formed from the substrate side in this order; a first gate insulating film 106 formed around the first body region 104; a first gate 107 formed around the first gate insulating film 106; a second gate insulating film 111 formed around the second body region 109; a second gate 112 formed around the second gate insulating film 111; a third gate insulating film 116 formed around the third body region 114; a third gate 117 formed around the third gate insulating film 116; a first output terminal 123 connecting the fifth first-conductivity-type silicon layer 110 and the first second-conductivity-type silicon layer 113 to each other; a second pillar-shaped silicon layer 134 which is formed on the first output terminal 123 and in which a third second-conductivity-type silicon layer 118, a fourth body region 119, and a fourth second-conductivity-type silicon layer 120 are formed from the substrate side in this order; a fourth gate insulating film 121 formed around the fourth body region 119; and a fourth gate 122 formed around the fourth gate insulating film 121. The first output terminal 123 is connected to the third second-conductivity-type silicon layer 118. The first gate 107 and the fourth gate 122 are connected to each other, and the second gate 112 and the third gate 117 are connected to each other.

The semiconductor device preferably includes a first contact 124 that connects the second gate 112 and the third gate 117 to each other. Since the first contact 124 enables vertical connection between the second gate 112 and the third gate 117, the area can be reduced compared with the case where contacts are separately formed for the second gate 112 and the third gate 117.

The first conductivity type is an n-type, and the second conductivity type is a p-type.

The first output terminal 123 is preferably composed of a metal.

The first output terminal 123 may be composed of silicon. When the first output terminal 123 is composed of silicon, the first output terminal 123 may be formed by silicidation.

The first gate 107, the second gate 112, the third gate 117, and the fourth gate 122 are each preferably composed of a metal. The metal is preferably titanium nitride or titanium aluminum nitride. Tungsten may also be used. The first gate insulating film 106, the second gate insulating film 111, the third gate insulating film 116, and the fourth gate insulating film 121 are each preferably an oxide film, a nitride film, an oxynitride film, or a high-K dielectric film.

The semiconductor device also includes a first power supply line 129 connected to the second second-conductivity-type silicon layer 115 and the fourth second-conductivity-type silicon layer 120.

An input metal wiring 128 is connected to the first contact 124. The first gate 107 is connected to the fourth gate 122 via a contact 125, a metal wiring 130, and a contact 127. The first output terminal 123 is connected to an output metal wiring 131 via a contact 126.

The first pillar-shaped silicon layer 133 is arranged in a first column of a first row, and the second pillar-shaped silicon layer 134 is arranged in a second column of the first row. With this arrangement, the first contact 124 and the contacts 125, 126, and 127 can be arranged at the respective vertices of a quadrangle.

An insulating film 132 is formed around the elements.

Another embodiment of the present invention will be described. FIGS. 2A to 2D illustrate the structure of a semiconductor device according to another embodiment of the present invention. In this embodiment, silicon is used as a semiconductor; however, a semiconductor other than silicon may be alternatively used.

The semiconductor device includes a fifth second-conductivity-type silicon layer 202 formed on a silicon substrate 201; a third pillar-shaped silicon layer 233 which is formed above the silicon substrate 201 and in which a sixth second-conductivity-type silicon layer 203, a fifth body region 204, a seventh second-conductivity-type silicon layer 205, a sixth first-conductivity-type silicon layer 208, a sixth body region 209, a seventh first-conductivity-type silicon layer 210, an eighth first-conductivity-type silicon layer 213, a seventh body region 214, and a ninth first-conductivity-type silicon layer 215 are formed from the substrate side in this order; a fifth gate insulating film 206 formed around the fifth body region 204; a fifth gate 207 formed around the fifth gate insulating film 206; a sixth gate insulating film 211 formed around the sixth body region 209; a sixth gate 212 formed around the sixth gate insulating film 211; a seventh gate insulating film 216 formed around the seventh body region 214; a seventh gate 217 formed around the seventh gate insulating film 216; a second output terminal 223 connecting the seventh second-conductivity-type silicon layer 205 and the sixth first-conductivity-type silicon layer 208 to each other; a fourth pillar-shaped silicon layer 234 which is formed above the silicon substrate 201 and in which an eighth second-conductivity-type silicon layer 218, an eighth body region 219, and a ninth second-conductivity-type silicon layer 220 are formed from the substrate side in this order; an eighth gate insulating film 221 formed around the eighth body region 219; and an eighth gate 222 formed around the eighth gate insulating film 221. The second output terminal 223 is connected to the ninth second-conductivity-type silicon layer 220. The fifth gate 207 and the sixth gate 212 are connected to each other, and the seventh gate 217 and the eighth gate 222 are connected to each other. Since both the third pillar-shaped silicon layer 233 and the fourth pillar-shaped silicon layer 234 can be formed above the silicon substrate 201, single crystal silicon can be used with which both the third pillar-shaped silicon layer 233 and the fourth pillar-shaped silicon layer 234 are obtained by processing the substrate.

The semiconductor device preferably includes a second contact 224 that connects the fifth gate 207 and the sixth gate 212 to each other. Since the second contact 224 enables vertical connection between the fifth gate 207 and the sixth gate 212, the area can be reduced compared with the case where contacts are separately formed for the fifth gate 207 and the sixth gate 212.

The first conductivity type is an n-type, and the second conductivity type is a p-type.

The second output terminal 223 is preferably composed of a metal.

The second output terminal 223 may be composed of silicon. When the second output terminal 223 is composed of silicon, the second output terminal 223 may be formed by silicidation.

The fifth gate 207, the sixth gate 212, the seventh gate 217, and the eighth gate 222 are each preferably composed of a metal. The metal is preferably titanium nitride or titanium aluminum nitride. Tungsten may also be used. The fifth gate insulating film 206, the sixth gate insulating film 211, the seventh gate insulating film 216, and the eighth gate insulating film 221 are each preferably an oxide film, a nitride film, an oxynitride film, or a high-K dielectric film.

The semiconductor device includes a first ground line 229 connected to the ninth first-conductivity-type silicon layer 215.

An input metal wiring 228 is connected to the second contact 224. The seventh gate 217 is connected to the eighth gate 222 via a contact 225, a metal wiring 230, and a contact 227. The second output terminal 223 is connected to an output metal wiring 231 via a contact 226.

The third pillar-shaped silicon layer 233 is arranged in a first column of a first row, and the fourth pillar-shaped silicon layer 234 is arranged in a second column of the first row. With this arrangement, the second contact 224 and the contacts 225, 226, and 227 can be arranged at the respective vertices of a quadrangle.

An insulating film 232 is formed around the elements.

Note that various embodiments and modifications of the present invention can be made without departing from the broad spirit and scope of the present invention. The embodiments described above are intended to describe illustrative examples of the present invention and do not limit the scope of the present invention.

For example, a method for producing a semiconductor device in which the p-type (including the p$^+$-type) and the n-type (including the n$^+$-type) in the above embodiments are each changed to the opposite conductivity type and a semiconductor device obtained by using the method are obviously within the technical scope of the present invention.

What is claimed is:

1. A semiconductor device comprising:
   a first first-conductivity-type semiconductor layer on a semiconductor substrate;
   a first pillar-shaped semiconductor layer above the semiconductor substrate and including sequentially from the substrate a second first-conductivity-type semiconductor layer, a first body region, a third first-conductivity-type semiconductor layer, a fourth first-conductivity-type semiconductor layer, a second body region, a fifth first-conductivity-type semiconductor layer, a first second-conductivity-type semiconductor layer, a third body region, and a second second-conductivity-type semiconductor layer;
   a first gate insulating film around the first body region;
   a first gate around the first gate insulating film;
   a second gate insulating film around the second body region;
   a second gate around the second gate insulating film;
   a third gate insulating film around the third body region;
   a third gate around the third gate insulating film;
   a first output terminal connecting the fifth first-conductivity-type semiconductor layer and the first second-conductivity-type semiconductor layer to each other;
   a second pillar-shaped semiconductor layer on the first output terminal and a third second-conductivity-type semiconductor layer, a fourth body region, and a fourth second-conductivity-type semiconductor layer sequentially overlie the substrate;
   a fourth gate insulating film around the fourth body region; and
   a fourth gate around the fourth gate insulating film,
   wherein the first output terminal is connected to the third second-conductivity-type semiconductor layer,
   wherein the first gate and the fourth gate are connected to each other, and
   wherein the second gate and the third gate are connected to each other.

2. The semiconductor device according to claim 1, further comprising:
   a first contact connecting the second gate and the third gate to each other.

3. The semiconductor device according to claim 1, wherein the first conductivity type is an n-type and the second conductivity type is a p-type.

4. The semiconductor device according to claim 1, wherein the first output terminal is composed of a metal.

5. The semiconductor device according to claim 1, wherein the first output terminal is composed of a semiconductor.

6. The semiconductor device according to claim 1, wherein the first gate, the second gate, the third gate, and the fourth gate are each composed of a metal.

7. The semiconductor device according to claim 1, further comprising:
   a first power supply line connected to the second second-conductivity-type semiconductor layer and the fourth second-conductivity-type semiconductor layer.

8. The semiconductor device according to claim 1,
   wherein the first pillar-shaped semiconductor layer is in a first column of a first row, and
   wherein the second pillar-shaped semiconductor layer is in a second column of the first row.

9. A semiconductor device comprising:
   a fifth second-conductivity-type semiconductor layer on a semiconductor substrate;
   a third pillar-shaped semiconductor layer above the semiconductor substrate and including sequentially from the substrate a sixth second-conductivity-type semiconductor layer, a fifth body region, a seventh second-conductivity-type semiconductor layer, a sixth first-conductivity-type semiconductor layer, a sixth body region, a seventh first-conductivity-type semiconductor layer, an eighth first-conductivity-type semiconductor layer, a seventh body region, and a ninth first-conductivity-type semiconductor layer;
   a fifth gate insulating film around the fifth body region;
   a fifth gate around the fifth gate insulating film;
   a sixth gate insulating film around the sixth body region;
   a sixth gate around the sixth gate insulating film;
   a seventh gate insulating film around the seventh body region;
   a seventh gate around the seventh gate insulating film;
   a second output terminal connecting the seventh second-conductivity-type semiconductor layer and the sixth first-conductivity-type semiconductor layer to each other;
   a fourth pillar-shaped semiconductor layer above the semiconductor substrate and including sequentially from the substrate an eighth second-conductivity-type semiconductor layer, an eighth body region, and a ninth second-conductivity-type semiconductor layer;
   an eighth gate insulating film around the eighth body region; and
   an eighth gate around the eighth gate insulating film,
   wherein the second output terminal is connected to the ninth second-conductivity-type semiconductor layer,
   wherein the fifth gate and the sixth gate are connected to each other, and wherein the seventh gate and the eighth gate are connected to each other.

10. The semiconductor device according to claim 9, further comprising:
a second contact connecting the fifth gate and the sixth gate to each other.

11. The semiconductor device according to claim 9, wherein the first conductivity type is an n-type and the second conductivity type is a p-type.

12. The semiconductor device according to claim 9, wherein the second output terminal is composed of a metal.

13. The semiconductor device according to claim 9, wherein the second output terminal is composed of a semiconductor.

14. The semiconductor device according to claim 9, wherein the fifth gate, the sixth gate, the seventh gate, and the eighth gate are each composed of a metal.

15. The semiconductor device according to claim 9, further comprising a first ground line connected to the ninth first-conductivity-type semiconductor layer.

16. The semiconductor device according to claim 9,
wherein the third pillar-shaped semiconductor layer is in a first column of a first row, and
wherein the fourth pillar-shaped semiconductor layer is in a second column of the first row.

* * * * *